(12) United States Patent
Uchida et al.

(10) Patent No.: US 9,101,957 B2
(45) Date of Patent: Aug. 11, 2015

(54) PASTE SUPPLY METHOD

(71) Applicant: PANASONIC CORPORATION, Osaka (JP)

(72) Inventors: Hideki Uchida, Yamanashi (JP); Takashi Yazawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 122 days.

(21) Appl. No.: 14/007,769

(22) PCT Filed: Mar. 6, 2013

(86) PCT No.: PCT/JP2013/001414
§ 371 (c)(1),
(2) Date: Sep. 26, 2013

(87) PCT Pub. No.: WO2014/010145
PCT Pub. Date: Jan. 16, 2014

(65) Prior Publication Data
US 2014/0203037 A1    Jul. 24, 2014

(30) Foreign Application Priority Data
Jul. 10, 2012    (JP) .................................. 2012-154260

(51) Int. Cl.
*B05D 1/26* (2006.01)
*B41F 15/08* (2006.01)
(Continued)

(52) U.S. Cl.
CPC . *B05D 1/26* (2013.01); *B41F 15/08* (2013.01); *B41F 15/40* (2013.01); *H05K 3/1233* (2013.01); *H05K 3/3484* (2013.01)

(58) Field of Classification Search
CPC ......... B05C 17/015; B05D 1/26; B41F 15/08; B41F 15/40; H05K 3/1233; H05K 3/3484
USPC ............... 222/1, 160, 164, 165, 167; 141/284
See application file for complete search history.

(56) References Cited

U.S. PATENT DOCUMENTS

| 2002/0050217 A1 | 5/2002 | Shimizu et al. |
| 2009/0008398 A1* | 1/2009 | Nakatsuji et al. ............. 220/737 |
| 2011/0315029 A1 | 12/2011 | Abe et al. |
| 2012/0132317 A1* | 5/2012 | Luchinger ..................... 141/284 |

(Continued)

FOREIGN PATENT DOCUMENTS

| JP | 10-157066 A | 6/1998 |
| JP | 11-227156 A | 8/1999 |

(Continued)

OTHER PUBLICATIONS

International Search Report for PCT/JP2013/001414 dated Apr. 9, 2013.

Primary Examiner — Kevin P Shaver
Assistant Examiner — Robert Nichols, II
(74) Attorney, Agent, or Firm — Pearne & Gordon LLP

(57) ABSTRACT

With a substantially intermediate position as a starting point, a syringe is reciprocated in an X-axial direction with a given reciprocation range by a plurality of times, and a stringiness portion that hangs down from a paste discharge port toward a mask plate is cut off in an intermediate portion thereof. The syringe is traveled to the substantially intermediate position, and with this position as a starting point, the syringe is reciprocated with a reciprocation range smaller than the reciprocation range of the paste cutting operation, and a part of the residual paste hanging from the paste shakes off downward. The syringe is traveled in an end direction of a guide member side, the syringe is rotated about an axial line, and translated into a horizontal storage posture.

4 Claims, 14 Drawing Sheets

(51) Int. Cl.
 *B41F 15/40* (2006.01)
 *H05K 3/12* (2006.01)
 *H05K 3/34* (2006.01)

(56) References Cited

U.S. PATENT DOCUMENTS

2013/0319267 A1* 12/2013 Tanaka et al. .................. 101/123
2015/0009524 A1* 1/2015 Fujimoto et al. ............. 358/1.14

FOREIGN PATENT DOCUMENTS

| | | |
|---|---|---|
| JP | 2001-1239208 A | 9/2001 |
| JP | 2002-137360 A | 5/2002 |
| JP | 2004-058299 A | 2/2004 |
| JP | 2011-031181 A | 2/2011 |
| JP | 2011-140176 A | 7/2011 |
| JP | 2011-189672 A | 9/2011 |
| JP | 2012-081681 A | 4/2012 |

* cited by examiner

PASTE SUPPLY METHOD

TECHNICAL FIELD

The present invention relates to a paste supply method for supplying a paste onto an upper surface of a paste supply object.

BACKGROUND ART

A screen printing machine is designed in such a manner that a paste such as a solder paste or a conductive paste is supplied onto an upper surface of a mask plate (paste supply target) in which a plurality of pattern holes corresponding to an arrangement of electrodes on a substrate are formed by a paste supply syringe, and a squeegee having a lower end brought into contact with the upper surface of the mask plate reciprocates to slide on the mask plate with the results that the pattern holes are filled with the paste to transfer the paste onto the electrodes of the substrate brought into contact with the lower surface of the mask plate. Also, in recent years, from the viewpoints of simplifying the mechanism and accelerating a paste replenishing operation into the paste supply syringe, a configuration in which the paste supply syringe and the squeegee are fitted to the same member so as to be movable integrally has been used.

In the screen printing machine of this type, in order to improve the workability of squeegee replacement attributable to a change in the type of substrate, there has been proposed a mechanism in which the paste supply syringe is changed from a paste supply posture in which a paste discharge port of the paste supply syringe is directed downward is changed to a storage posture in which the paste discharge port is directed in a horizontal direction, and the paste supply syringe is stored in a position where the replacement operation of the squeegee is not blocked.

Specifically, a travel mechanism that rotatably attaches the paste supply syringe, and travels the paste supply syringe in the horizontal direction, and a guide member having a curved guide surface in an upper surface thereof on a travel path of the paste supply syringe are provided, and in a process of traveling the paste supply syringe by the travel mechanism, a cam follower disposed in the paste supply syringe is abutted against the guide surface, and the paste supply syringe is rotated along the guide surface through the cam follower, to thereby translate the paste supply syringe from the paste supply posture into the storage position. According to this configuration, the paste supply syringe is translated into the storage posture and stored, thereby being capable of ensuring the replacement operation space of the squeegee, as a result of which the replacement operation of the squeegee can be facilitated.

CITATION LIST

Patent Literature

Patent Literature 1: JP-A-2011-140176

SUMMARY OF INVENTION

Technical Problem

The paste is a viscous fluid having thixotropy, and the discharge of the paste is generally configured by applying a pneumatic pressure into the paste supply syringe to extrude the paste from the paste discharge port. Therefore, even if paste supply operation is finished, a residual pressure is present within the paste supply syringe for a given period. For that reason, the paste frequently hangs down from the paste discharge port after the paste supply operation has been finished. Under this situation, when the paste supply syringe is rotated and translated from the paste supply posture into the storage posture, there arises such a problem that the paste that hangs down from the paste discharge port is circumferentially scattered due to a centrifugal force exerted at the time of rotation.

Under the circumstances, the present invention aims at providing a paste supply method that can suppress the scattering of the paste that hangs down from the nozzle discharge port when the paste supply syringe is rotated and translated from a state in which the paste discharge port is directed downward into a state in which the paste discharge port is directed in the horizontal direction.

Solution to Problem

According to one aspect of the invention, there is provided a paste supply method of discharging a paste from a paste supply syringe having a paste discharge port directed downward to supply the paste onto an upper surface of a paste supply object, and thereafter rotating the paste supply syringe so that the paste discharge port is directed in a horizontal direction to store the paste supply syringe, the paste supply method including:

a paste cutting step of, after discharging the paste, reciprocating the paste supply syringe having the paste discharge port directed downward in the horizontal direction with a given range of reciprocation by a plurality of times to cut off the paste that hangs down from the paste discharge port toward the mask plate in an intermediate portion thereof; and a paste shaking-off step of, after cutting off the paste, reciprocating the paste supply syringe with a range of reciprocation smaller than that at the time of cutting off the paste by a plurality of times to shake off the residual hanging paste from the paste discharge port.

According to an invention, in the paste shaking-off step, the paste is shaken off to a degree that does not scatter the paste from the paste discharge port even if the paste supply syringe is rotated and stored after the paste shaking-off step.

According to an invention, the discharge of the paste from the paste supply syringe is conducted by applying a pneumatic pressure into the paste supply syringe, and the pneumatic pressure within the paste supply syringe is reduced to an atmospheric pressure level before the paste cutting step is finished.

According to an invention, a range of reciprocation of the paste supply syringe in the paste cutting step is set to be equal to or larger than a distance between the paste discharge port and an upper surface of the paste supply object.

Advantageous Effects

According to the present invention, after the paste has been discharged, the paste supply syringe having the paste discharge port directed downward is reciprocated in the horizontal direction with a given range of reciprocation by a plurality of times, as a result of which the paste that hangs down from the paste discharge port toward the mask plate is cut off in an intermediate portion thereof, and after the paste has been cut off, the paste supply syringe is reciprocated with a range of reciprocation smaller than that at the time of cutting off the paste by a plurality of times to shake off the residual hanging paste from the paste discharge port. With this configuration, most of the residual hanging paste can be removed from the nozzle discharge port, as a result of which the scattering of the paste from the paste discharge port at the time of rotating the paste supply syringe can be suppressed.

DESCRIPTION OF EMBODIMENTS

Figure 1:
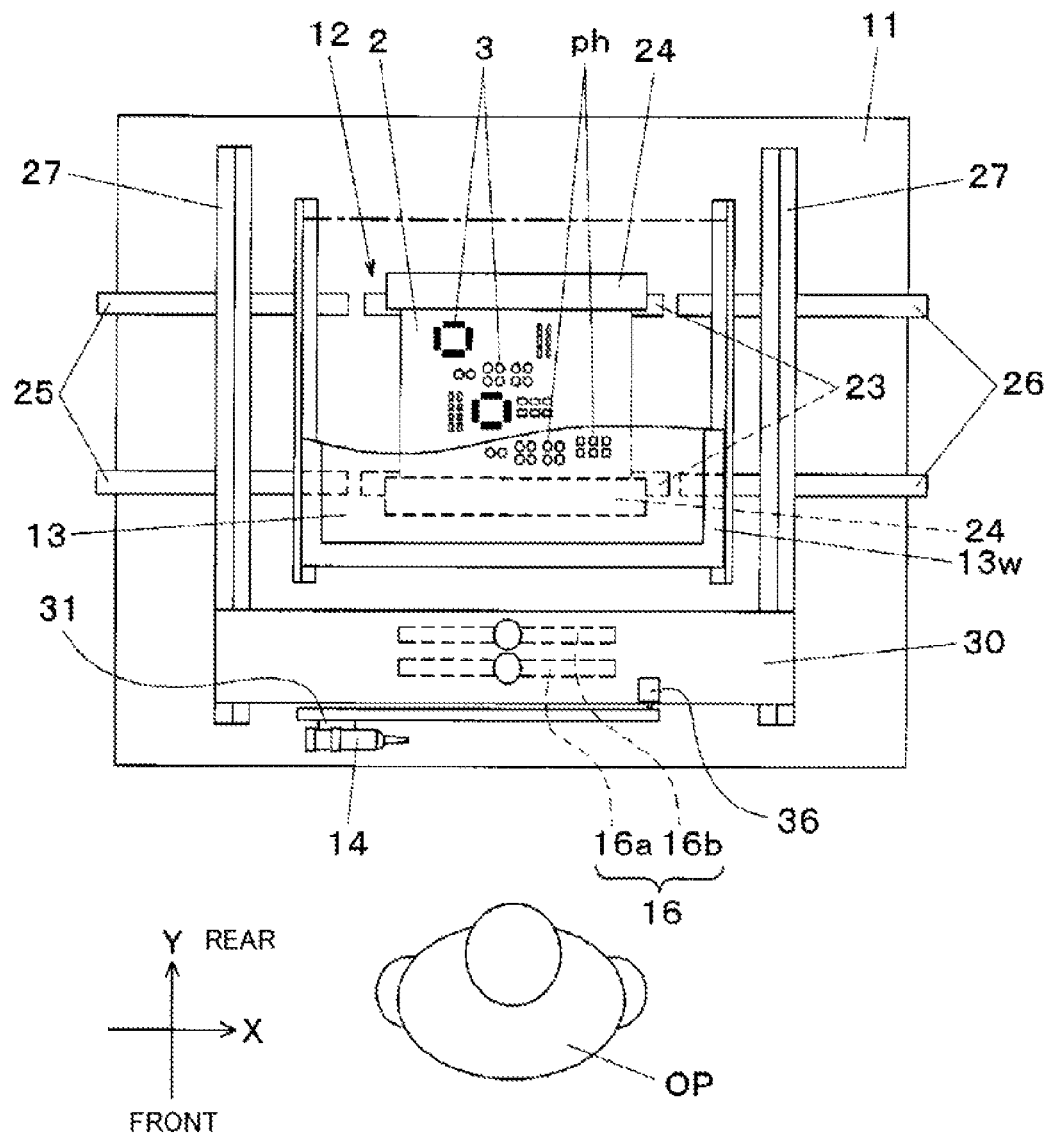
FIG. 1 is a partial plan view of a screen printing machine according to this embodiment.
Figure 2:
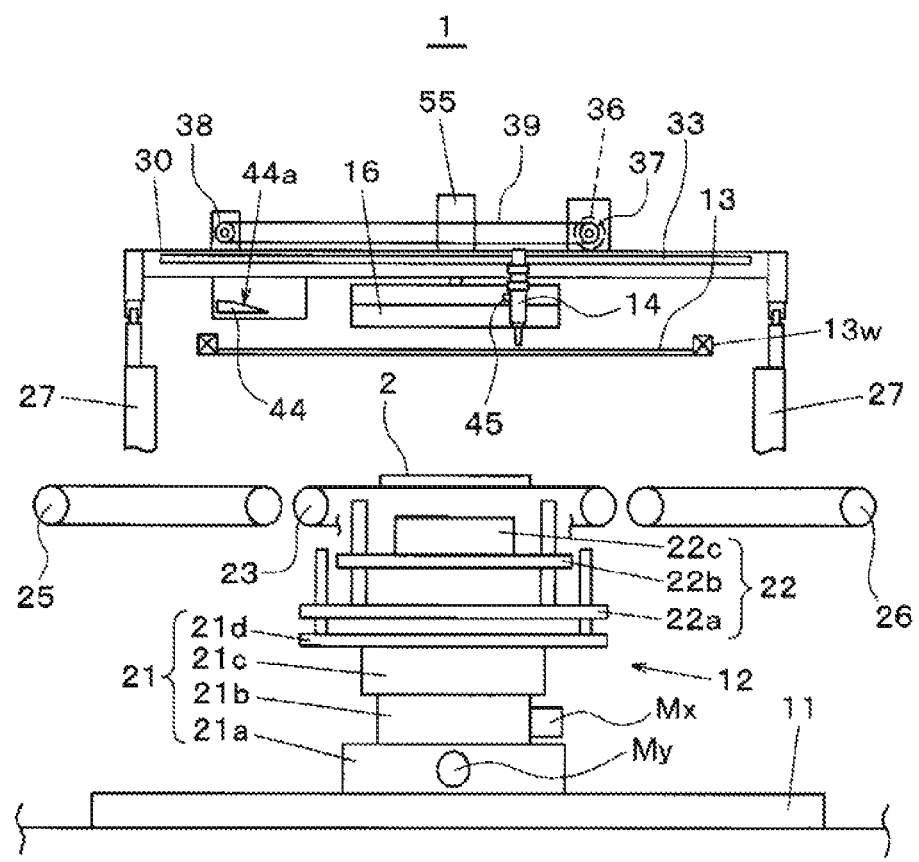
FIG. 2 is a front view of the screen printing machine according to this embodiment.
Figure 3:
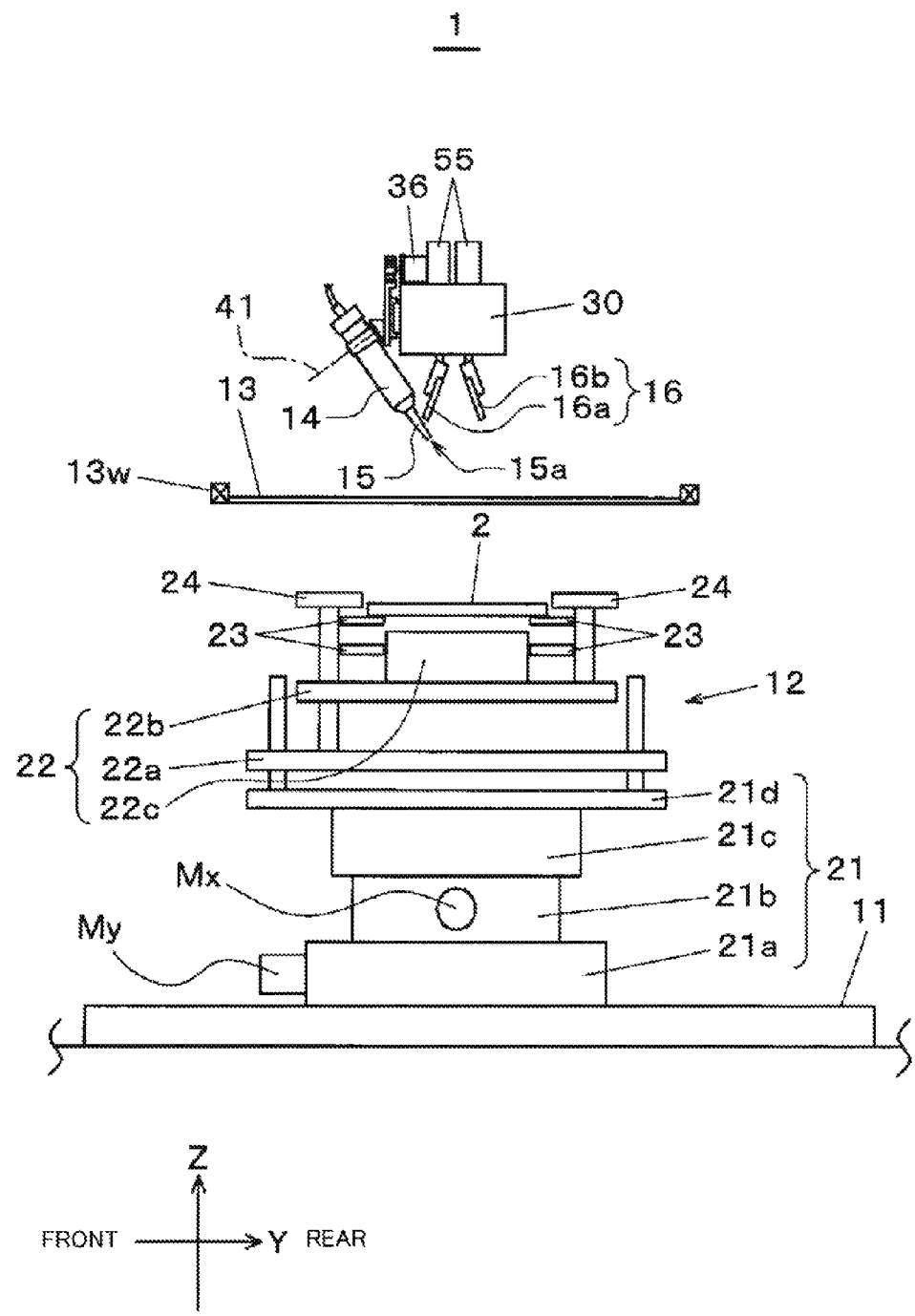
FIG. 3 is a side view of the screen printing machine according to this embodiment.

Hereinafter, embodiments of the present invention will be described with reference to the drawings. Referring to FIGS. 1, 2, and 3, a screen printing machine 1 according to this embodiment is configured to screen-print a paste such as a solder paste or a conductive paste on electrodes 3 formed on a surface of a substrate 2. The screen printing machine 1 includes a substrate positioning unit 12 that is disposed on a base 11, transports the substrate 2, and positions the substrate 2 at a given work position, a mask plate 13 that is disposed above the substrate positioning unit 12 as a paste supply object, a paste supply syringe 14, and a pair of squeegees 16. Hereinafter, it is assumed that a transport direction (a lateral direction of a paper plane in FIG. 1) of the substrate 2 is an X-axial direction, a horizontal direction (a vertical direction of the paper plane in FIG. 1) orthogonal to the X-axial direction is a Y-axial direction, and a vertical direction (a vertical direction of a paper plane in FIG. 2) is a Z-axial direction. Also, it is assumed that a side (a lower side of the paper plane in FIG. 1) at which an operator OP (FIG. 1) works is a front side of the screen printing machine 1, and an opposite side thereof (an upper side of the paper surface in FIG. 1) is a rear side of the screen printing machine 1.

Referring to FIGS. 2 and 3, the substrate positioning unit 12 includes a horizontal in-plane positioning unit 21 having a Y table 21a that travels in the Y-axial direction with respect to the base 11, an X table 21b that travels in the X-axial direction with respect to the Y table 21a, a θ table 21c that rotates about the Z-axis with respect to the X table 21b, and a base table 21d that is fixed onto an upper surface of the θ table 21c. The substrate positioning unit 12 also includes a vertical direction positioning unit 22 having a first lifting table 22a that moves up and down with respect to the base table 21d, a second lifting table 22b that moves up and down with respect to the first lifting table 22a, and a lower holding unit 22c that is disposed on an upper surface of the second lifting table 22b. Further, the substrate positioning unit 12 includes a positioning conveyor 23 having a pair of belt conveyor mechanisms that is fitted to the first lifting table 22a, transports the substrate 2 in the X-axial direction, and positions the substrate 2 at the given work position. Still further, the substrate positioning unit 12 includes a pair of clampers 24 that is opened and closed in the Y-axial direction above the positioning conveyor 23, and clamps (sandwiches) both sides of the substrate 2 on the positioning conveyor 23 in the Y-axial direction.

Referring to FIGS. 1 and 2, at positions of both sides of the positioning conveyor 23 in the X-axial direction are disposed an installation conveyor 25 that brings in the substrate 2 fed from an upstream side (left side of the paper plane) of the screen printing machine 1, and transfers the substrate 2 to the positioning conveyor 23, and a discharge conveyor 26 that discharges the substrate 2 delivered from the positioning conveyor 23 to a downstream side (right side of the paper plane) of the screen printing machine 1. Also, the mask plate 13 is supported at four sides by a frame member 13w having a rectangular shape in a plan view, and a rectangular region surrounded by the frame member 13w is formed with a large number of pattern holes ph provided in correspondence with the plurality of electrodes 3 on the substrate 2.

Referring to FIGS. 1 and 2, a pair of frame members 27 that spans the installation conveyor 25 and the discharge conveyor 26 in the Y-axial direction is disposed on the base 11. Both ends of a squeegee base 30 extending in the X-axial direction are supported on the frame members 27, and the squeegee base 30 is movable along the frame members 27 in the Y-axial direction. Also, the pair of squeegees 16 is disposed on the squeegee base 30 so as to face each other in the Y-axial direction. Each of the squeegees 16 is formed of a "paddle" member extending in the X-axial direction, and fitted to the squeegee base 30 so as to be movable up and down. Hereinafter, the squeegee disposed anteriorly in the pair of squeegees 16 is called front squeegee 16a, and the squeegee disposed posteriorly is called rear squeegee 16b.

Figure 4:
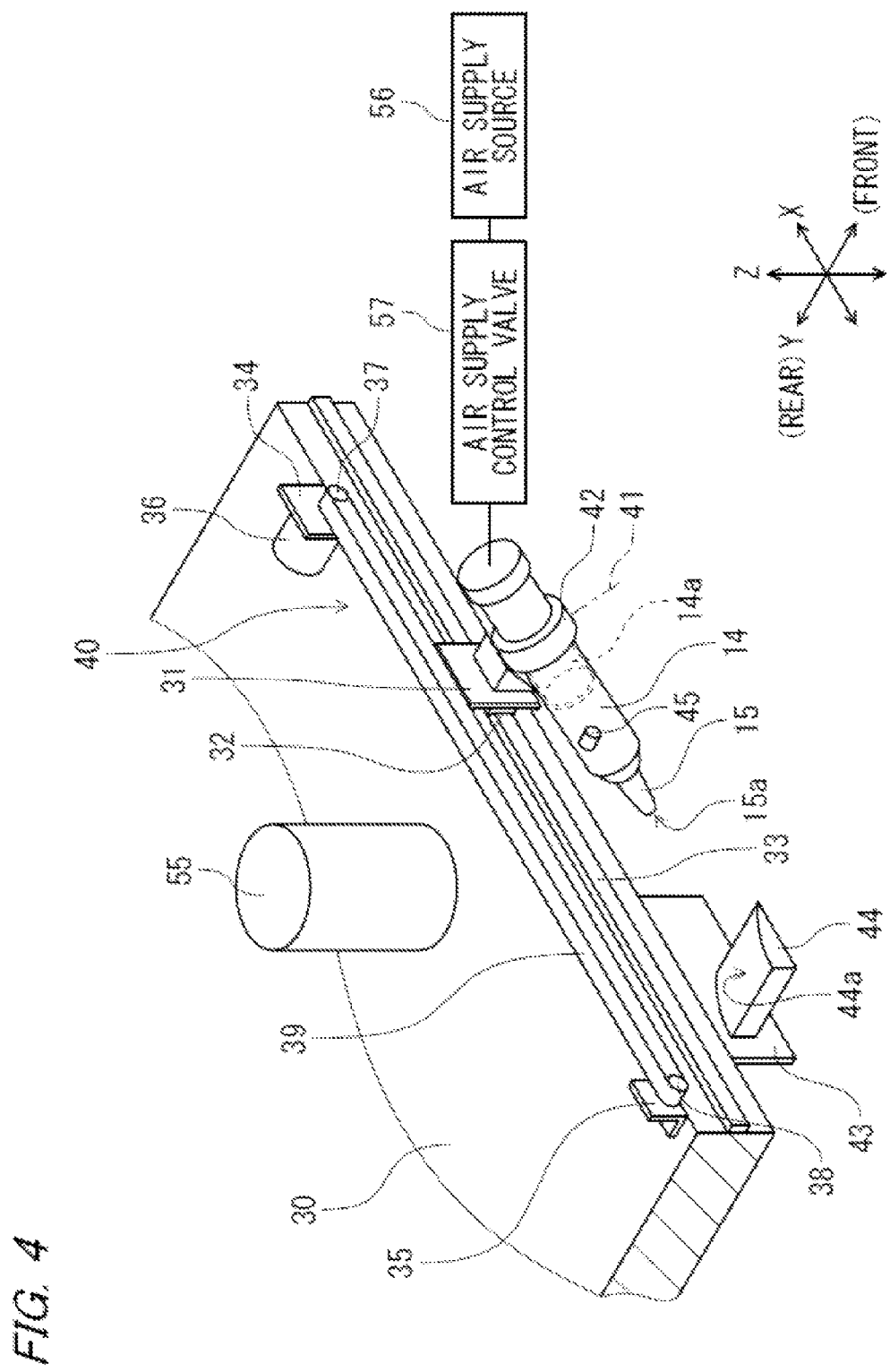
FIG. 4 is a partial perspective view of the screen printing machine according to this embodiment.
Figure 5:
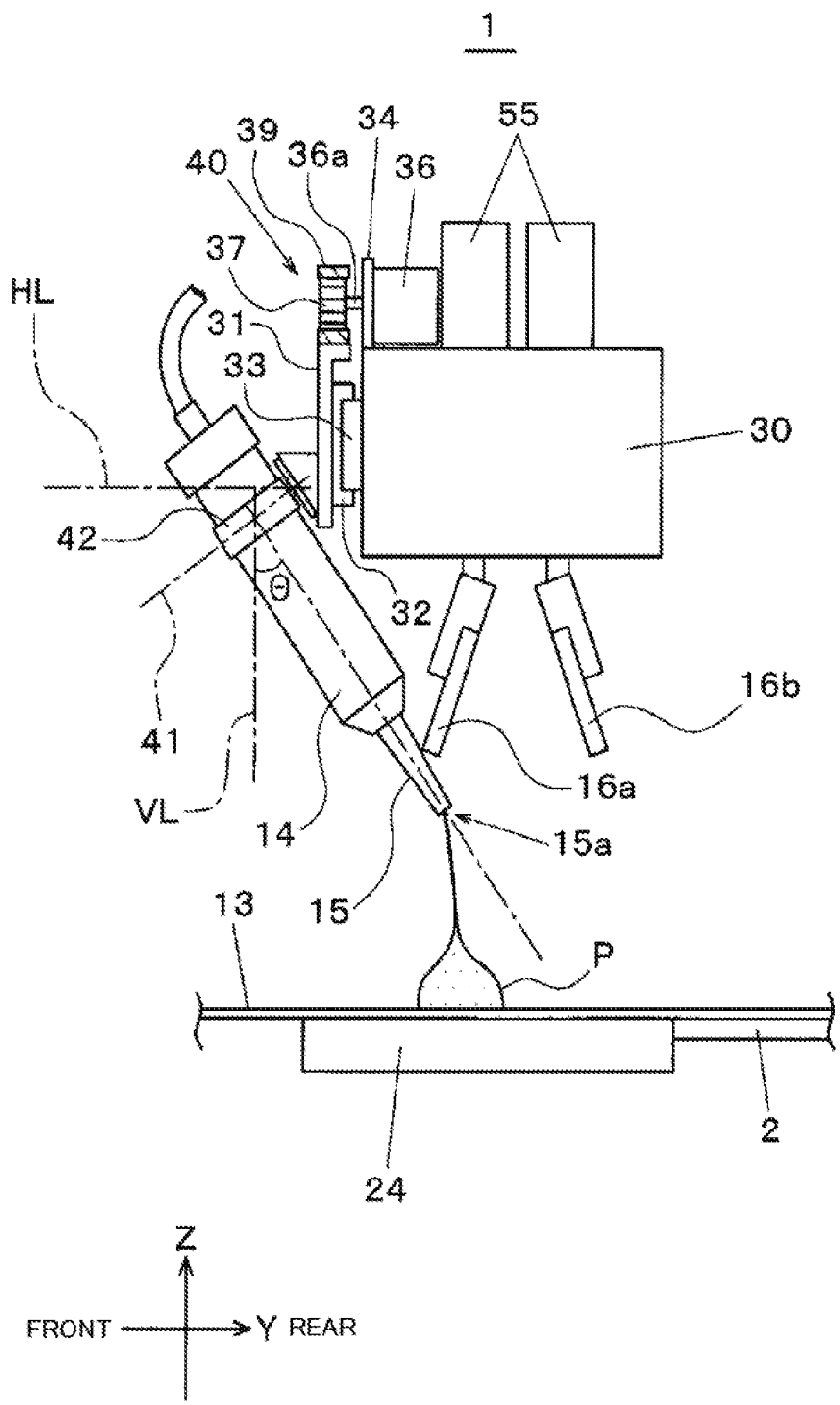
FIG. 5 is a partial side view of the screen printing machine according to this embodiment.

Referring to FIGS. 4 and 5, the paste supply syringe (hereinafter merely called "syringe") 14 is fitted to a front portion of the squeegee base 30 through a syringe attachment bracket 31, and the syringe attachment bracket 31 is movable in the X-axial direction while a slider 32 disposed on a rear surface of the syringe attachment bracket 31 facing the squeegee base 30 is engaged with a slide guide 33 disposed on a front surface of the squeegee base 30 so as to extend in the X-direction.

Also, the syringe 14 is connected with an air supply source 56 through an air supply control valve 57. A spool (not shown) of the air supply control valve 57 can be located at two positions including a paste discharge position where an air (air) from the air supply source 56 is supplied to an air supply chamber 14a formed within the paste supply syringe 14 to discharge a paste P from a paste discharge port 15a, and a paste discharge stop position where the air supply chamber 14a is opened to the atmosphere without supplying the air from the air supply source 56 to the paste supply syringe 14 to stop the discharge of the paste P from the paste discharge port 15a. That is, the air supply source 56 and the air supply control valve 57 configure a paste supply mechanism that supplies the paste P onto the mask plate 13 through the syringe 14.

Figure 6:
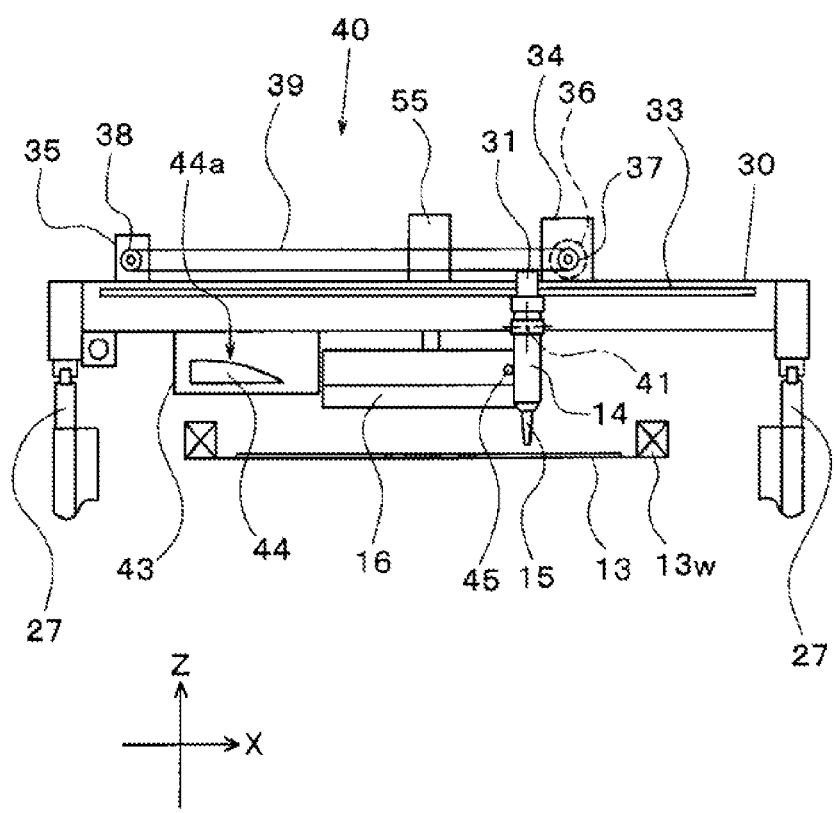
FIG. 6 is a partial front view of the screen printing machine according to this embodiment.

Referring to FIGS. 4, 5, and 6, both ends, in the X-axial direction, of an upper surface front end of the squeegee base 30 are each attached with a motor attachment bracket 34 and a driven pulley attachment bracket 35, and the motor attachment bracket 34 is attached with a syringe travel motor 36. A driving shaft 36a (FIG. 5) of the syringe travel motor 36 penetrates through the motor attachment bracket 34 horizontally, and extends forward, and a leading end of the driving shaft 36a is attached with a driving pulley 37. On the other hand, a pulley axis (not shown) extending from the driven pulley attachment bracket 35 forward in the horizontal direction is attached with a driven pulley 38.

A toothed belt 39 is extended between the driving pulley 37 and the driven pulley 38, and an upper surface of an upper portion of the syringe attachment bracket 31 is fixed to an lower surface of the toothed belt 39. For that reason, when the driving shaft 36a of the syringe travel motor 36 is driven to rotate the driving pulley 37, the toothed belt 39 travels in the X-axial direction, as a result of which the syringe attachment bracket 31 travels in the X-axial direction. That is, the syringe travel motor 36, the driving pulley 37, the driven pulley 38, and the toothed belt 39 configure a syringe travel mechanism 40 that travels the syringe 14 in a horizontal direction orthogonal to a reciprocating direction of the squeegee base 30.

In this example, the paste supply syringe 14 conducts the operation of supplying the paste P (FIG. 5) stored within the paste supply syringe 14 obliquely downward in a state where the paste supply syringe 14 is in the paste supply posture (FIGS. 2 to 5). A travel range (travel stroke) of the paste supply syringe 14 in the X-axial direction by the syringe travel mechanism 40 has a range that can cover at least a width (dimension in the X-axial direction) of the substrate 2 which is treated by the screen printing machine 1.

Referring to FIGS. 4, 5, and 6, the front surface of the syringe attachment bracket 31 disposed in front of the squeegee base 30 is equipped with a syringe holder 42 that is rotatable about an axial line 41 extending to be inclined forward obliquely downward with respect to a horizontal line HL (FIG. 5) on a vertical in-plane (a YZ in-plane parallel to the paper plane of FIG. 5) parallel to the reciprocating direction of the squeegee base 30 as an axis. The syringe 14 is held by the syringe holder 42, and rotatable about the axial line 41. For that reason, the paste supply syringe 14 can translate the posture between the paste supply posture where the paste supply syringe 14 extends to be inclined backward (right side of the paper plane in FIG. 5) obliquely with respect to a vertical line VL (FIG. 5) by a given angle θ on the above vertical in-plane (YZ in-plane) so that a nozzle portion 15 (paste discharge port 15a) on a lower end of the paste supply syringe 14 is located immediately below the front squeegee 16a, and the storage posture (FIG. 1) in which the paste supply syringe 14 is rotated about the axial line 41 from the paste supply posture by about 90 degrees. The above given angle θ can be arbitrarily set as an angle at which the paste can be supplied immediately below the front squeegee 16a in the state where the paste supply syringe 14 is in the paste supply posture.

Also, as illustrated in FIGS. 4 and 6, a guide member attachment bracket 43 extending downward is disposed on a front lower portion of the squeegee base 30, and a guide member (cam member) 44 having a curved guide surface 44a that gently descends toward a center side of the squeegee base 30 in the X-axial direction is disposed on the front surface of the guide member attachment bracket 43 so as to be projected forward.

Figure 7A:
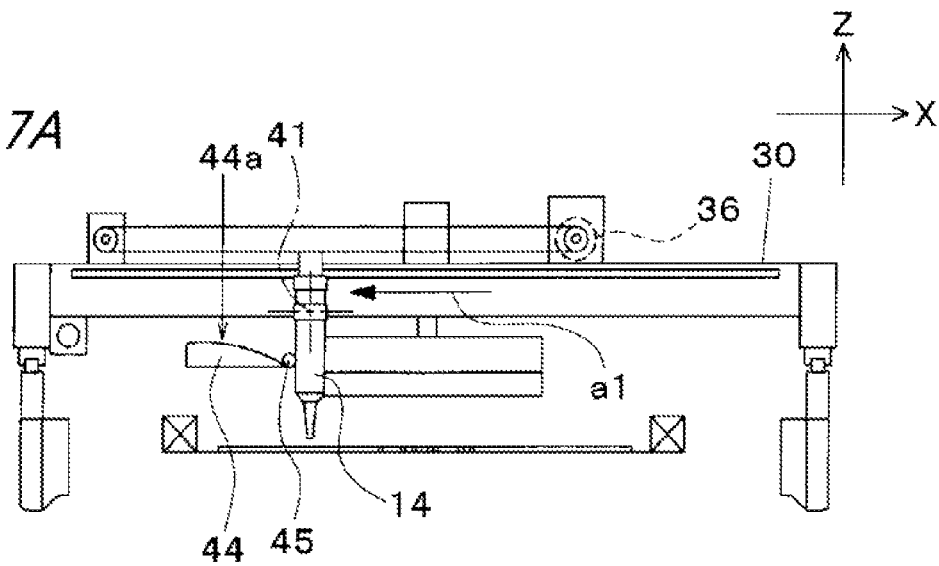
FIGS. 7A, 7B, and 7C are illustrative views of the operation of the screen printing machine according to this embodiment.
Figure 7B:
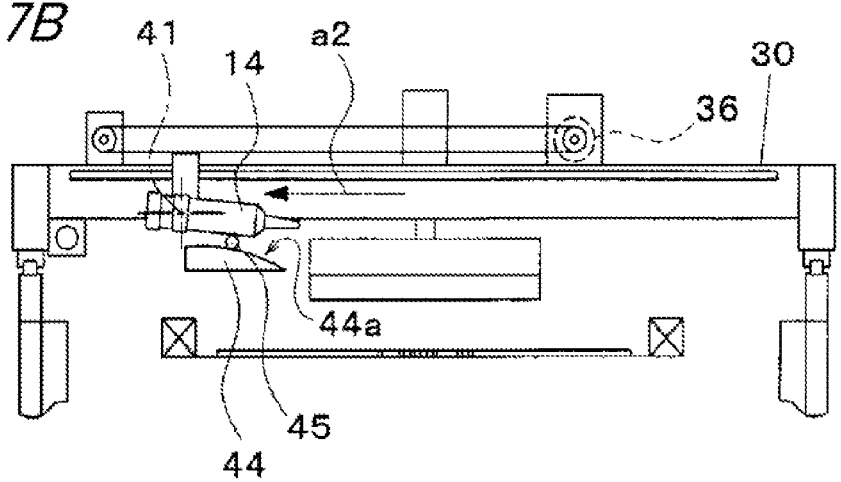
Figure 7C:
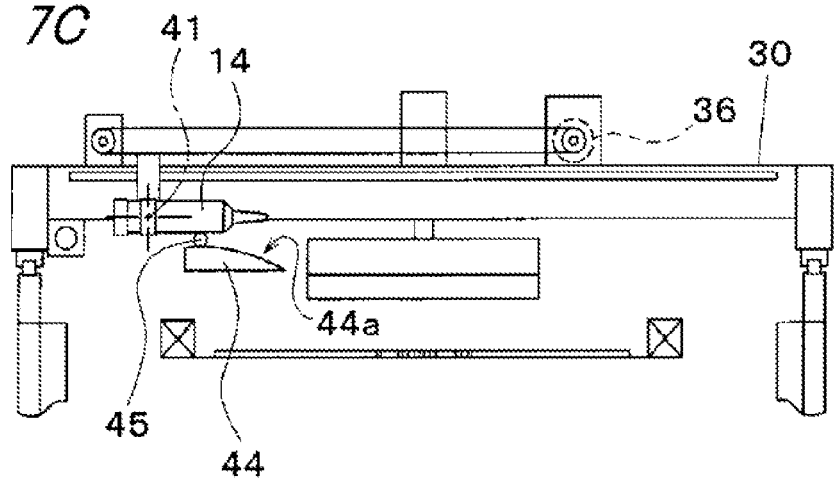

As illustrated in FIG. 7A, in the center portion of the squeegee base 30 in the X-axial direction, the syringe travel motor 36 is driven to travel the syringe 14 in the end direction of the guide member 44 side (arrow a1), from the state in which the syringe 14 is in the paste supply posture. Then, when the syringe 14 arrives at a neighborhood of the end of a travel stroke of the syringe 14, a first cam follower 45 as a driven member which is disposed on a side surface of the paste supply syringe 14 at a position lower than the axial line 41 is abutted against a guide surface 44a of the guide member 44. Thereafter, when the paste supply syringe 14 further travels in the end direction of the guide member 44 side (arrow a2 indicated in FIG. 7B), the first cam follower 45 is transferred on the guide surface 44a, and a lower portion of the syringe 14 is pushed up by the guide member 44, and rotated about the axial line 41 (FIG. 7B). Finally, the syringe 14 becomes in a horizontal storage posture in which the syringe 14 is rotated by substantially 90 degrees (FIG. 7C). That is, when the syringe 14 of the paste supply posture travels in the horizontal direction orthogonal to the reciprocating direction of the squeegee base 30 by the syringe travel mechanism 40, the guide member 44 guides the first cam follower 45 disposed on a portion below the axial line 41 of the syringe 14, and rotates the syringe 14 about the axial line 41 by substantially 90 degrees into the storage posture.

Figure 8:
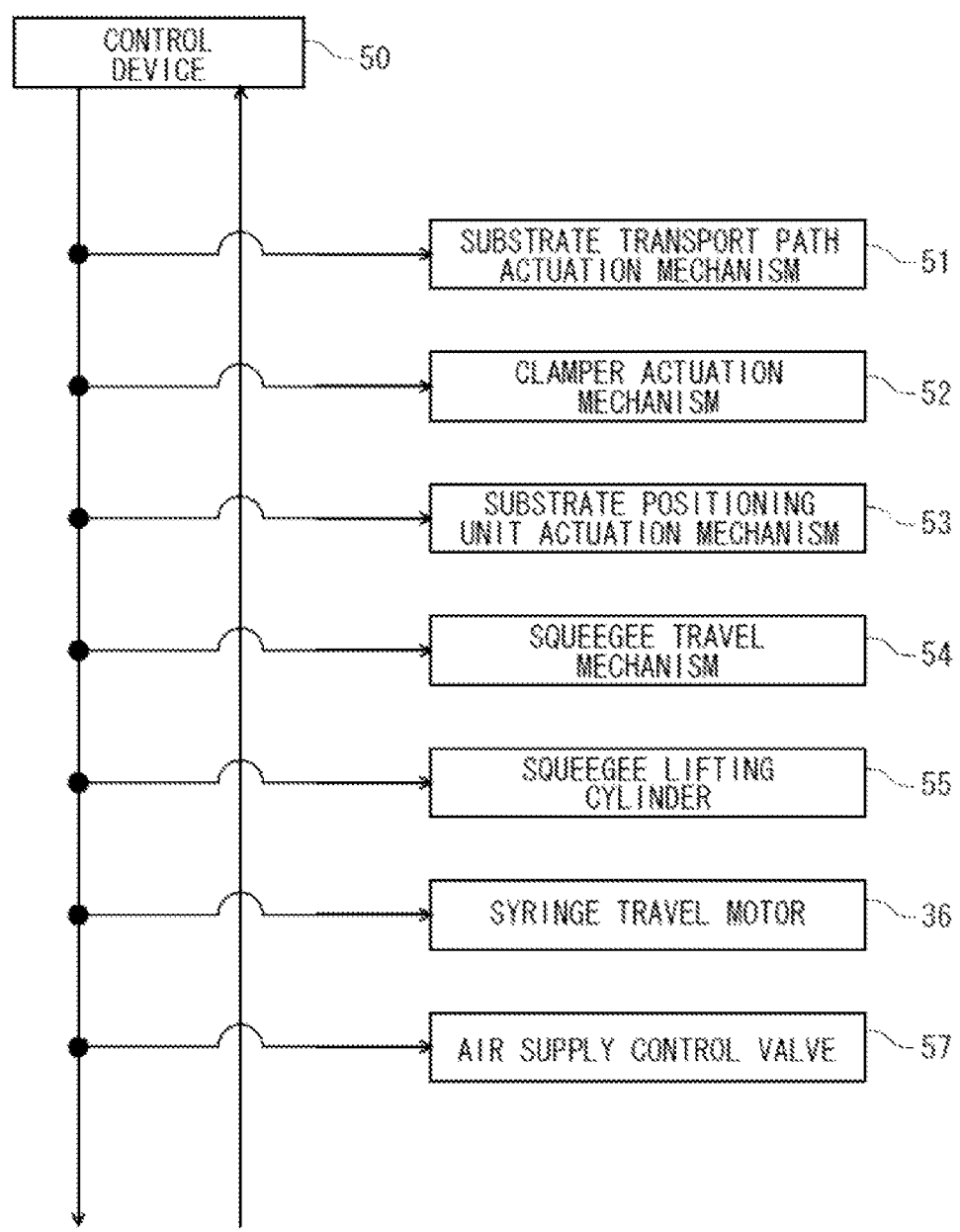
FIG. 8 is a block diagram illustrating a control system of the screen printing machine according to this embodiment.

Subsequently, a control system of the screen printing machine 1 will be described with reference to FIG. 8. The respective operation of the installation conveyor 25, the positioning conveyor 23, and the discharge conveyor 26 as a substrate transport path that transports the substrate 2 is conducted by allowing a control device 50 provided in the screen printing machine 1 to control the actuation of a substrate transport path actuation mechanism 51 including an actuator, etc., not shown. The clamp operation of the substrate 2 by the respective clampers 24 is conducted by allowing the control device 50 to control the actuation of a clamper actuation mechanism 52 including an actuator, etc. not shown.

The respective operation of the travel of the Y table 21a in the Y-axial direction, the travel of the X table 21b in the X-axial direction, the rotation of the θ table 21c about the Z-axis, the moving up and down of the first lifting table 22a, and the moving up and down of the second lifting table 22b is conducted by allowing the control device 50 to control the actuation of a substrate positioning unit actuation mechanism 53 including actuators such as a Y-table drive motor My and an X-table drive motor Mx (FIGS. 2 and 3). Also, the travel of the squeegee base 30 in the Y-axial direction is conducted by allowing the control device 50 to control the actuation of a squeegee travel mechanism 54 such as an actuator not shown. The operation of moving up and down the respective squeegees 16 is conducted by allowing the control device 50 to control the actuation of a squeegee lifting cylinder 55 attached to an upper portion of the squeegee base 30.

The travel of the paste supply syringe 14 in the X-axial direction is conducted by allowing the control device 50 to control the actuation of the syringe travel motor 36. Also, the discharge operation of the paste P by the syringe 14 and the halt of the discharge operation of the paste P are conducted by allowing the control device 50 to control the actuation of the spool of the air supply control valve 57.

Figure 9:
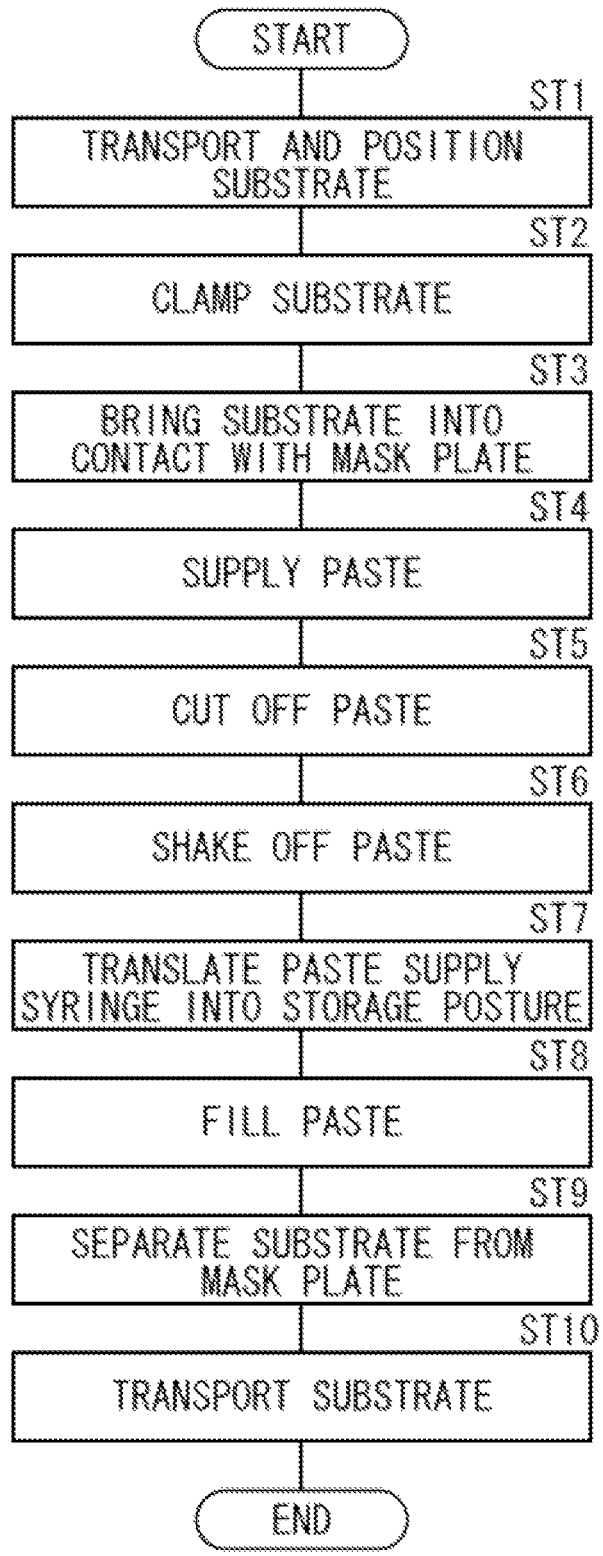
FIG. 9 is a flowchart illustrating a flow of screen printing operation according to this embodiment.
Figure 10A:
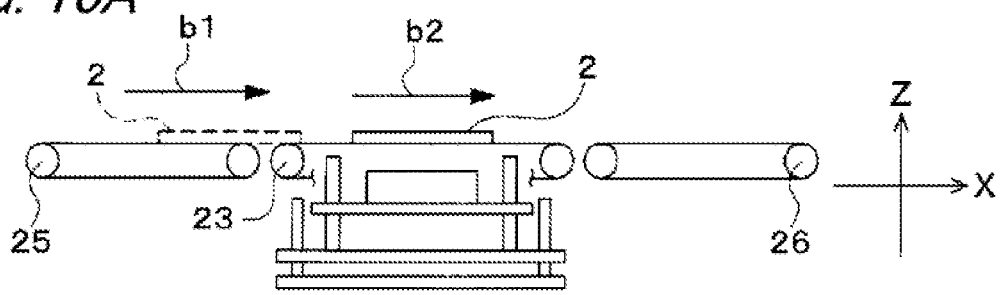
FIGS. 10A, 10B, 10C, and 10D are illustrative views of the operation of the screen printing machine according to this embodiment.

The screen printing machine 1 according to this embodiment is configured as described above. Subsequently, the screen printing operation will be described with reference to a flowchart of FIG. 9, and operation illustrative views of FIGS. 10A, 10B, 10C, 10D to 14A, 14B, and 14C. First, as illustrated in FIG. 10A, the control device 50 transports the substrate 2 to the downstream side by the installation conveyor 25 (arrow b1), and delivers the substrate 2 to the positioning conveyor 23. Then, the control device 50 transports the substrate 2 to a given work position by the positioning conveyor 23 (arrow b2), and positions the substrate 2 (substrate transporting and positioning step in ST1).

Figure 10B:
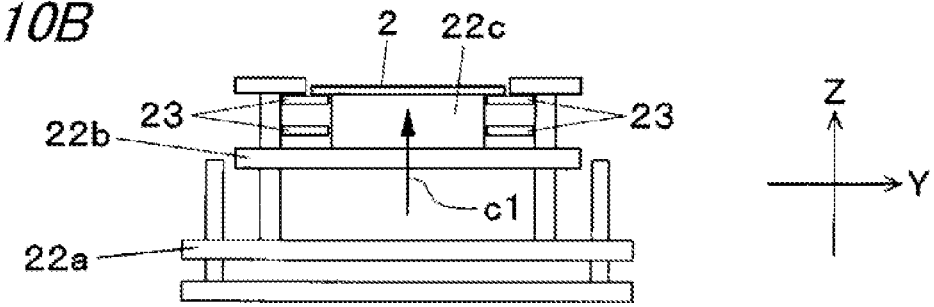
Figure 10C:
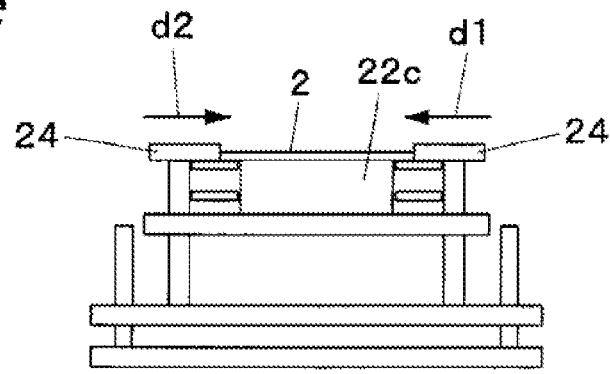

Then, as illustrated in FIG. 10B, the control device 50 moves up the second lifting table 22b with respect to the first lifting table 22a (arrow c1), and stops the operation of moving up the second lifting table 22b at timing when an upper surface of the lower holding unit 22c contacts with a lower surface of the substrate 2. Then, as illustrated in FIG. 10C, the control device 50 moves the respective clampers 24 in a direction of coming closer to each other (arrows d1, d2) to clamp the substrate 2 from both sides thereof (clamping step in ST2).

Figure 10D:
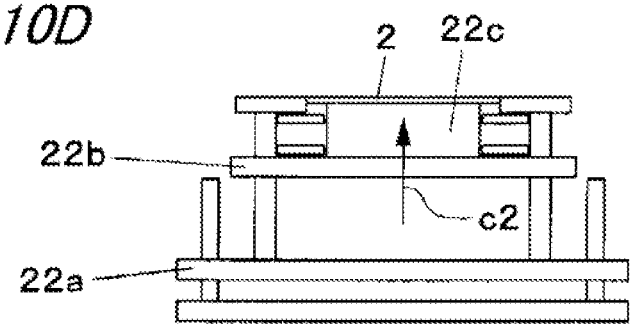
Figure 11A:
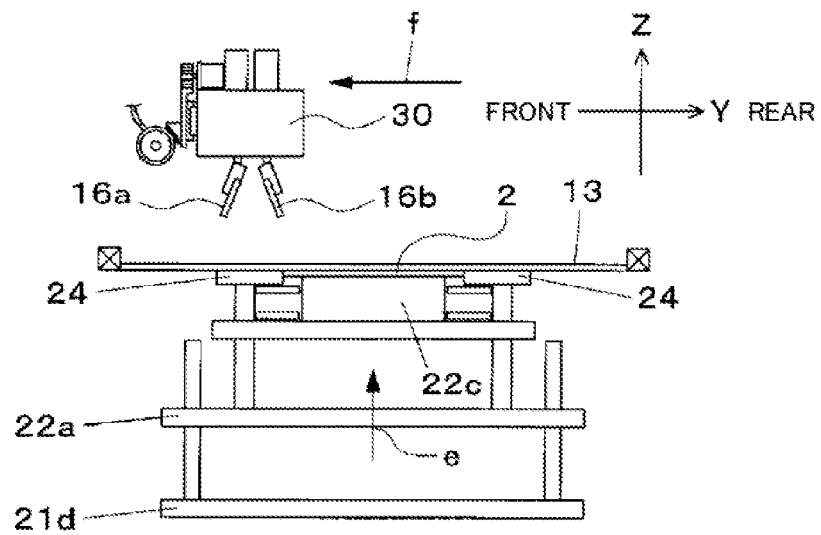
FIGS. 11A, 11B, and 11C are illustrative views of the operation of the screen printing machine according to this embodiment.

Then, as illustrated in FIG. 10D, the control device 50 again moves up the second lifting table 22b (arrow c2) to push up the substrate 2 by the lower holding unit 22c, and stops the operation of pushing up the lower holding unit 22c at timing when the upper surface of the substrate 2 becomes substantially flush with the upper surfaces of the respective clampers 24. Then, as illustrated in FIG. 11A, the control device 50 moves up the first lifting table 22a with respect to the base table 21d (arrow e), and brings the upper surface of the substrate 2 into contact with the mask plate 13 from below (mask plate contacting step in ST3). As a result, the pattern holes ph of the mask plate 13 match the electrodes 3 on the substrate 2 vertically.

Figure 11B:
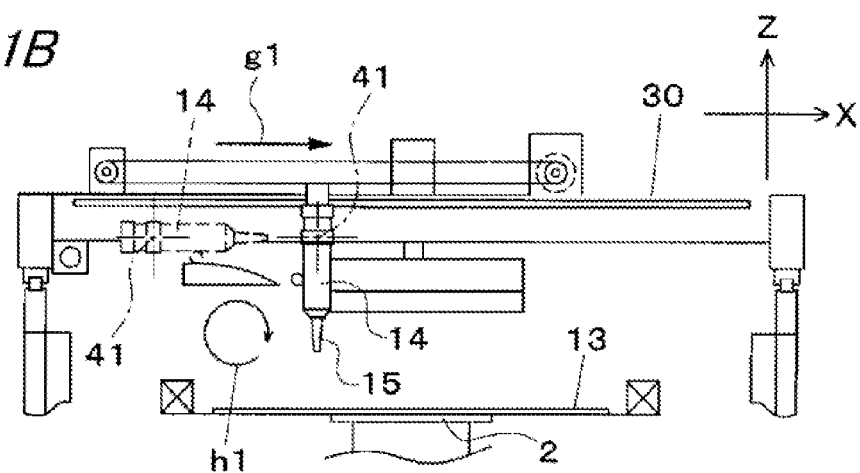

Then, the control device 50 travels the squeegee base 30 in the Y-axial direction (arrow f) to position the front squeegee 16a immediately above the front clamper 24 (FIG. 11A). Then, as illustrated in FIG. 11B, the control device 50 travels the syringe 14 in the X-axial direction (arrow g1) to rotate the syringe 14 about the axial line 41 by substantially 90 degrees from the storage posture, and translates the syringe 14 into the paste supply posture.

Figure 11C:
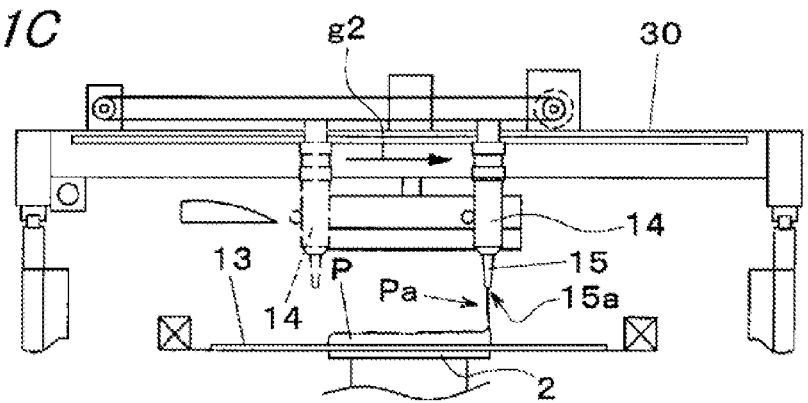

Then, the control device 50 supplies air to the air supply chamber 14a of the syringe 14 in a state where the syringe 14 is translated into the paste supply posture to discharge the paste P from the paste discharge port 15a of the nozzle portion 15. In this way, the paste P is supplied onto the mask plate 13. As illustrated in FIG. 11C, the above-mentioned discharge operation is conducted while the syringe 14 is traveling in the X-axial direction (arrow g2) so that the paste P is evenly supplied in the width direction of the substrate 2 at the time of supplying the paste P (paste supply step in ST4).

Then, the control device 50 stops the supply of air into the air supply chamber 14a to finish the discharge of the paste P from the paste discharge port 15a. For a given time after the paste discharge operation has been finished, the residual pressure of air may be present within the air supply chamber 14a. For that reason, even after the paste discharge operation has been finished, a slight amount of paste P is discharged by the residual pressure of air from the paste discharge port 15a, and connected to the paste P supplied onto the mask plate 13 in a filament (FIG. 11C). Hereinafter, the paste P that hangs down from the paste discharge port 15a toward the mask plate 13 is called "stringiness portion Pa". In this embodiment, the operation of removing the stringiness portion Pa is conducted after the operation of discharging the paste P has been finished and before the operation of translating the syringe 14 into the storage posture is conducted.

Figure 12A:
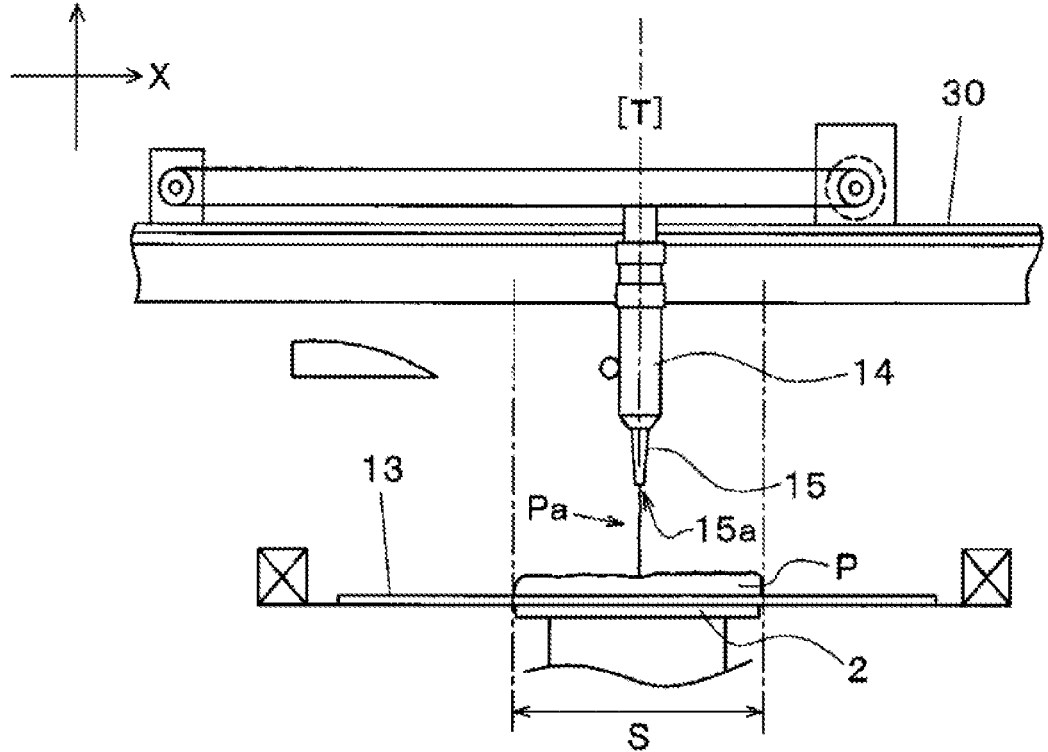
FIGS. 12A and 12B are illustrative views of the operation of the screen printing machine according to this embodiment.

First, as illustrated in FIG. 12A, in the state where the syringe 14 is in the paste supply posture, the control device 50 travels the syringe 14 so that the paste discharge port 15a is located at a substantially intermediate position [T] (above a substantially intermediate position of the paste P viewed from the width direction) of a travel range (travel stroke) S of the syringe 14 when conducting the operation of discharging the paste P.

Then, the control device 50 reciprocates the syringe 14 in the X-axial direction with a given reciprocation range R1 by a plurality of times with the substantially intermediate position [T] as a starting point (arrow i1 indicated in FIG. 12B) to cut off the paste P (stringiness portion Pa) that hangs down from the paste discharge port 15a toward the mask plate 13 in the vicinity of the intermediate portion (paste cutting step in ST5). In this way, the above-mentioned substantially intermediate position [T] becomes an operation start position for starting the reciprocation of the syringe 14. In this embodiment, a travel stroke S of the syringe 14 in the above-mentioned paste cutting operation is about 50 mm, and the number of reciprocations is five.

Figure 12B:
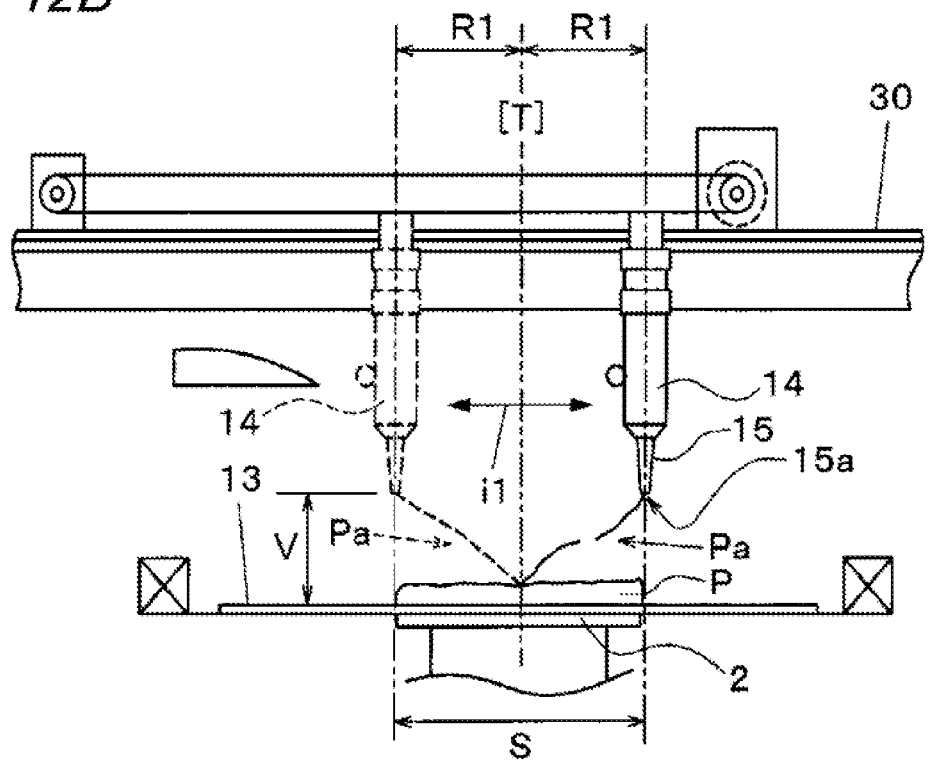

It is desirable that the reciprocation range R1 is equal to or larger than a distance V between the paste discharge port 15a and the upper surface of the mask plate 13 (FIG. 12B). Also, the reciprocation range of the syringe 14 is set within the travel stroke S of the syringe 14 in the operation of discharging the paste P. As a result, the cut paste P is allowed to fall to the paste P supplied onto the mask plate 13, thereby being capable of preventing the paste P from falling to another position on the mask plate 13.

Also, the control device 50 controls the actuation of the spool of the air supply control valve 57, and reduces a pneumatic pressure within the syringe 14 (air supply chamber 14a) to an atmospheric pressure level before the reciprocation of the syringe 14 is finished, thereby being capable of suppressing a case in which the paste P is discharged from the paste discharge port 15a by the residual pressure of air within the syringe 14 (air supply chamber 14a) after the reciprocation has been finished to inhibit the effectiveness of the operation of cutting off the paste P (stringiness portion Pa). A time required to reduce the pneumatic pressure within the syringe 14 (air supply chamber 14a) to the atmospheric pressure level can be adjusted by setting an inner diameter of an atmospheric pressure release pipe conduit (not shown) connected to the air supply chamber 14a to a desired length.

Figure 13A:
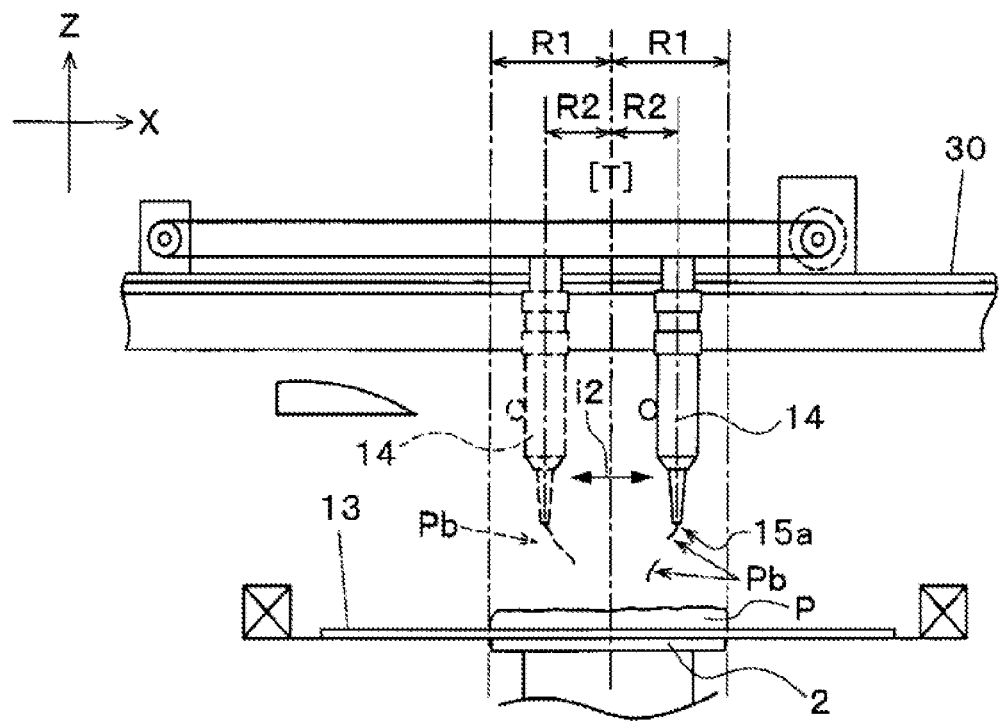
FIGS. 13A and 13B are illustrative views of the operation of the screen printing machine according to this embodiment.

After the paste P (stringiness portion Pa) has been cut off, the control device 50 conducts the operation of removing the residual paste Pb (FIG. 13A) hanging down from the paste discharge port 15a. Specifically, as illustrated in FIG. 13A, the control device 50 travels the syringe 14 to the substantially intermediate position [T], and again reciprocates the syringe 14 with a reciprocation range R2 smaller than the reciprocation range R1 of the above-mentioned paste cutting operation by a plurality of times with the above position as a starting point to shake off a part of the residual paste Pb hanging down from the paste discharge port 15a downward (paste shaking off step in ST6). In this embodiment, the travel stroke S of the syringe 14 in the operation of shaking off the paste P is about 20 mm, and the number of reciprocations is 10.

In the above-mentioned operation of shaking off the paste P, a part of the residual paste Pb hanging down from the paste discharge port 15a is shaken off by an inertia force corresponding (proportional) to an operation acceleration generated when starting the travel of the syringe 14 and when stopping the travel of the syringe 14. Therefore, the operation acceleration of the syringe 14 in the operation of shaking off the paste P is larger than the operation acceleration of the syringe 14 in the operation of supplying the paste P. In this embodiment, the operation acceleration of the syringe 14 in the operation of supplying the paste P is set to 120 mm/s, and the operation acceleration of the syringe 14 in the operation of shaking off the paste P is set to 360 mm/s which is about three times as large as that in the supply operation. The operation acceleration of the syringe 14 in the operation of cutting off the paste P (stringiness portion Pa) hanging down from the paste discharge port 15a toward the mask plate 13 after supplying the paste may be set to the same degree as the operation acceleration of the syringe 14 in the above-mentioned operation of shaking off the paste P to shake off the paste P.

Figure 13B:
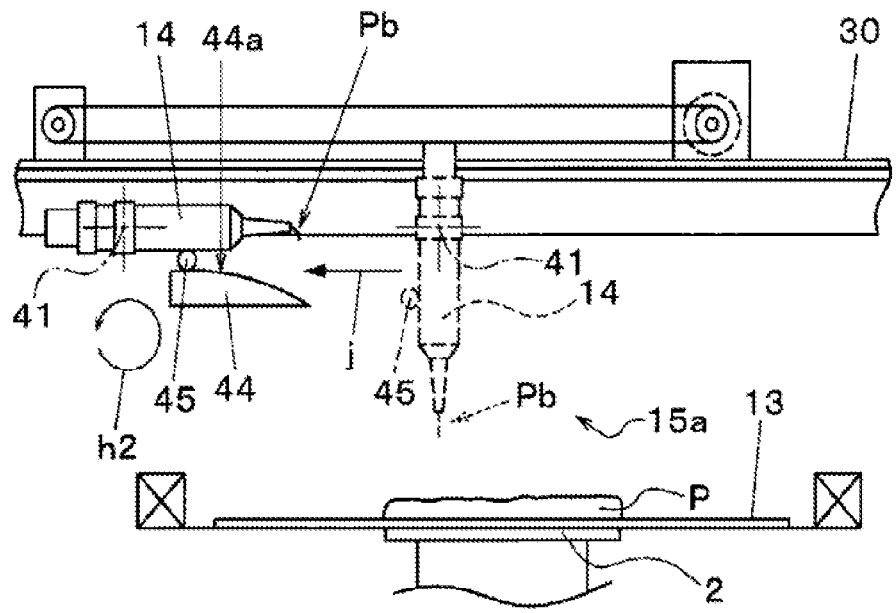

After the operation of shaking off the paste Pb, as illustrated in FIG. 13B, the control device 50 travels the syringe 14 in the end direction of the guide member 44 side (arrow j), thereby transferring the first cam follower 45 on the guide surface 44a to push up the lower portion of the syringe 14. Further, the control device 50 travels the syringe 14 in a direction of the arrow j, thereby rotating the syringe 14 about the axial line 41 (arrow h2) to translate the syringe 14 into the horizontal storage posture (storage posture translating step in ST7).

In this situation, a centrifugal force is exerted on the residual paste Pb hanging down from the paste discharge port 15a at the time of rotating the syringe 14 described above. However, the syringe 14 is reciprocated with a given reciprocation range by a plurality of time before rotating the syringe 14, thereby cut off the paste P (stringiness portion Pa) hanging down from the paste discharge port 15a toward the mask plate 13 in an intermediate portion thereof. Then, the operation of reciprocating the syringe 14 with a reciprocation range smaller than that in the operation of cutting off the paste P by a plurality of times to shake off the residual paste Pb hanging down from the paste discharge port 15a is executed. Therefore, the amount of residual paste Pb hanging down from the paste discharge port 15a at the time of rotating the syringe 14 is very small, as a result of which the paste Pb can be prevented from being scattered from the paste discharge port 15a at the time of rotating syringe 14.

Also, in the operation of shaking off the paste Pb, the paste P is shaken off to a degree that does not scatter the paste Pb from the paste discharge port 15a even if the syringe 14 is rotated and stored after the operation of shaking off the paste Pb, as a result of which the scattering of the paste P from the paste discharge port 15a at the time of rotating the syringe 14 can be further suppressed.

Figure 14A:
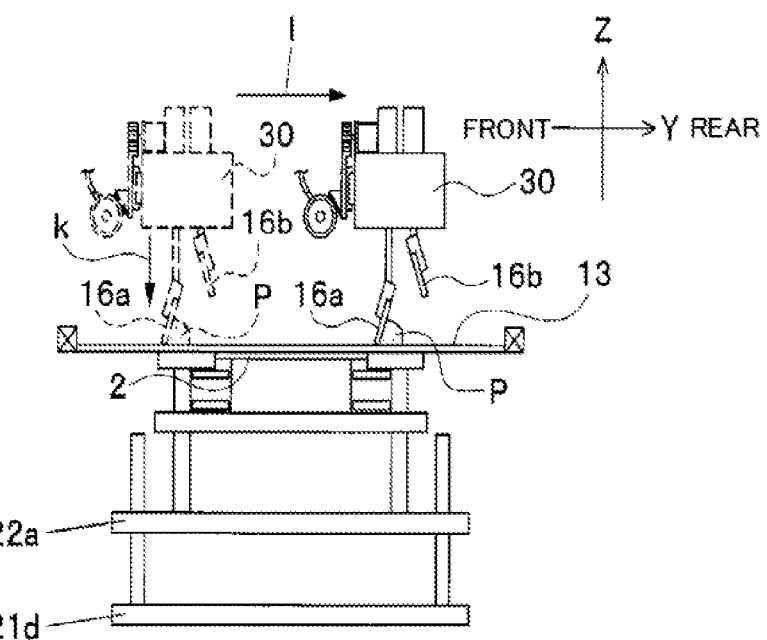
FIGS. 14A, 14B, and 14C are illustrative views of the operation of the screen printing machine according to this embodiment.

If the syringe 14 is stored, as illustrated in FIG. 14A, after the control device 50 moves down the front squeegee 16a (arrow k) to abut a lower edge of the front squeegee 16a against the upper surface of the mask plate 13, the squeegee base 30 is traveled in the Y-axial direction (arrow l) to slide the front squeegee 16a on the mask plate 13. As a result, the pattern holes ph in the mask plate 13 are filled with the paste P (paste filling step in ST8).

Figure 14B:
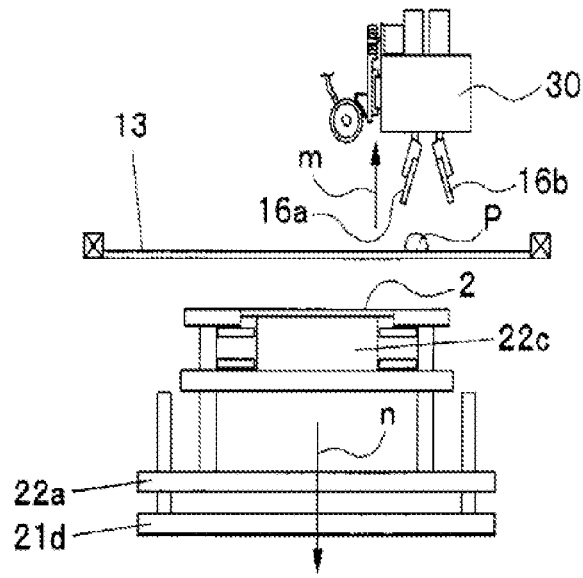
Figure 14C:
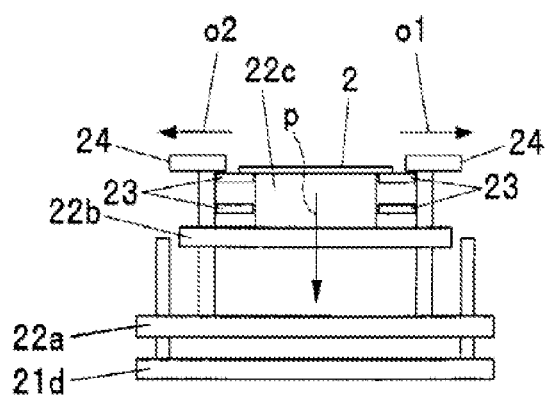

Subsequently, as illustrated in FIG. 14B, the control device 50 moves up the front squeegee 16a (arrow m), and also moves down the first lifting table 22a with respect to the base table 21d (arrow n) to separate the substrate 2 from the mask plate 13. With this operation, plate releasing is conducted, and the paste P is printed on the electrodes 3 of the substrate 2 (plate releasing step in ST9). Thereafter, as illustrated in FIG. 14C, the control device 50 travels the respective clampers 24 in a direction of separating from each other (arrows o1, o2) to halt the clamp state of the substrate 2. Also, the control device 50 moves down the second lifting table 22b with respect to the first lifting table 22a (arrow p), and unloads the substrate 2 onto the conveyor 23. Then, the control device 50 delivers the substrate 2 onto the discharge conveyor 26, and discharges the substrate 2 to the external of the screen printing machine 1 (substrate discharge step in ST10), and completes the screen printing operation.

As described above, in this embodiment, after discharging the paste P, the paste supply syringe 14 having the paste discharge port 15a directed downward is reciprocated in the horizontal direction with the given range of reciprocation by the plurality of times to cut off the paste P (stringiness portion Pa) that hangs down from the paste discharge port 15a toward the mask plate 13 (paste supply object) in the intermediate portion thereof, and after cutting off the paste P, the paste supply syringe 14 is reciprocated with the reciprocation range smaller than that at the time of cutting off the paste P by the plurality of times to shake off the residual hanging paste P (Pb) from the paste discharge port 15a. With the above process, most of the residual hanging paste P from the paste discharge port 15a can be removed from the nozzle discharge port, as a result of which the scattering of the paste P from the paste discharge port 15a at the time of rotating the paste supply syringe 14 can be suppressed.

The present invention is based on Japanese Patent Application No. 2012-154260 filed on Jul. 10, 2012, and content thereof is incorporated herein by reference.

INDUSTRIAL APPLICABILITY

According to the paste supply method of the present invention, the scattering of the paste P from the paste discharge port at the time of rotating the paste supply syringe can be suppressed, and useful in an electronic component mounting field in which an electronic component are mounted on a substrate having the paste printed on the electrodes.

REFERENCE SIGNS LIST 13, mask plate
14, paste supply syringe
15a, paste discharge port
P, paste

The invention claimed is:

1. A paste supply method of discharging a paste from a paste supply syringe having a paste discharge port directed downward to supply the paste onto an upper surface of a paste supply object, and thereafter rotating the paste supply syringe so that the paste discharge port is directed in a horizontal direction to store the paste supply syringe, the paste supply method comprising:
   a paste cutting step of, after discharging the paste, reciprocating the paste supply syringe having the paste discharge port directed downward in the horizontal direction with a given range of reciprocation by a plurality of times to cut off the paste that hangs down from the paste discharge port toward the mask plate in an intermediate portion thereof; and
   a paste shaking-off step of, after cutting off the paste, reciprocating the paste supply syringe with a range of reciprocation smaller than that at the time of cutting off the paste by a plurality of times to shake off the residual hanging paste from the paste discharge port.

2. The paste supply method according to claim 1 wherein in the paste shaking-off step, the paste is shaken off to a degree that does not scatter the paste from the paste discharge port even if the paste supply syringe is rotated and stored after the paste shaking-off step.

3. The paste supply method according to claim 1, wherein the discharge of the paste from the paste supply syringe is conducted by applying a pneumatic pressure into the paste supply syringe, and the pneumatic pressure within the paste supply syringe is reduced to an atmospheric pressure level before the paste cutting step is finished.

4. The paste supply method according to claim 1, wherein a range of reciprocation of the paste supply syringe in the paste cutting step is set to be equal to or larger than a distance between the paste discharge port and an upper surface of the paste supply object.

\* \* \* \* \*